(12) United States Patent
Takahashi et al.

(10) Patent No.: US 7,928,537 B2
(45) Date of Patent: Apr. 19, 2011

(54) ORGANIC ELECTROLUMINESCENT DEVICE

(75) Inventors: Toshiro Takahashi, Kanagawa (JP); Kazuo Hakamata, Kanagawa (JP)

(73) Assignee: Fujifilm Corporation, Tokyo (JP)

( * ) Notice: Subject to any disclaimer, the term of this patent is extended or adjusted under 35 U.S.C. 154(b) by 287 days.

(21) Appl. No.: 11/727,818

(22) Filed: Mar. 28, 2007

(65) Prior Publication Data
US 2007/0228368 A1 Oct. 4, 2007

(30) Foreign Application Priority Data

Mar. 31, 2006 (JP) ................................. 2006-100901
Mar. 31, 2006 (JP) ................................. 2006-100902

(51) Int. Cl.
*H01L 29/08* (2006.01)
*H01L 35/24* (2006.01)
*H01L 51/00* (2006.01)
*H01L 23/58* (2006.01)

(52) U.S. Cl. ... 257/638; 257/40; 257/642; 257/E51.001; 257/E51.022

(58) Field of Classification Search ................. 257/40, 257/638, 642, 99, 103, E33.064, E51.001, 257/E51.022; 313/501, 502, 509, 504
See application file for complete search history.

(56) References Cited

U.S. PATENT DOCUMENTS

| | | | | |
|---|---|---|---|---|
| 4,015,166 A * | 3/1977 | Ohshima et al. | ............... | 313/503 |
| 5,318,873 A * | 6/1994 | Kawamura et al. | ......... | 430/122.4 |
| 5,371,327 A * | 12/1994 | Fujinami et al. | ............... | 174/257 |
| 5,563,424 A * | 10/1996 | Yang et al. | ...................... | 257/40 |
| 5,601,903 A * | 2/1997 | Fujii et al. | ...................... | 428/212 |
| 5,759,080 A * | 6/1998 | Yoshioka et al. | ............... | 445/51 |
| 6,069,443 A * | 5/2000 | Jones et al. | .................... | 313/504 |
| 6,376,337 B1 * | 4/2002 | Wang et al. | .................... | 438/478 |
| 6,741,025 B2 * | 5/2004 | Tuck et al. | ...................... | 313/495 |
| 6,809,280 B2 * | 10/2004 | Divigalpitiya et al. | ........ | 200/512 |
| 7,052,931 B2 * | 5/2006 | Koo et al. | ........................ | 438/99 |
| 7,105,895 B2 * | 9/2006 | Wang et al. | .................... | 257/347 |
| 7,402,945 B2 * | 7/2008 | Yamazaki et al. | ............. | 313/504 |
| 7,459,177 B2 * | 12/2008 | Kimura et al. | ................. | 427/162 |
| 7,622,744 B2 * | 11/2009 | Sakata et al. | ..................... | 257/87 |
| 2001/0055458 A1 * | 12/2001 | Ladd | ............................. | 385/129 |
| 2003/0032361 A1 * | 2/2003 | Murasko et al. | ................ | 445/24 |
| 2004/0018379 A1 * | 1/2004 | Kinlen | ............................ | 428/690 |
| 2004/0160178 A1 * | 8/2004 | Qiu et al. | ........................ | 313/512 |
| 2004/0164674 A1 * | 8/2004 | Ottermann et al. | ............ | 313/506 |
| 2007/0207571 A1 * | 9/2007 | Morisue et al. | ................ | 438/107 |

FOREIGN PATENT DOCUMENTS

| | | | |
|---|---|---|---|
| JP | 11-40362 A | | 2/1999 |
| JP | 11040362 A | * | 2/1999 |
| JP | 2002-156633 A | | 5/2002 |
| JP | 2003-51380 A | | 2/2003 |
| JP | 2005-260821 A | | 9/2005 |

* cited by examiner

*Primary Examiner* — Teresa M Arroyo
(74) *Attorney, Agent, or Firm* — Birch, Stewart, Kolasch & Birch, LLP

(57) ABSTRACT

A functional device having, on a substrate, a pair of electrodes, a functional layer which is sandwiched between the electrodes and has an output that varies in accordance with an applied electric current, and a terminal arranged to apply an electric current to at least one of the electrodes, wherein an insulator is arranged between the electrodes and the density of the insulator decreases as the distance from the terminal increases, or wherein at least one of the electrodes has a notch section, and the ratio of the area of the notch section to the area of the electrode decreases as the distance from the terminal increases. This is an improved functional device which is excellent in production suitability and gives a uniform in-plane output, and can be rendered, in particular, an organic electroluminescence device.

10 Claims, 9 Drawing Sheets

ORGANIC ELECTROLUMINESCENT DEVICE

CROSS REFERENCE TO RELATED APPLICATIONS

This application claims priority under 35 USC 119 from Japanese Patent Application Nos. 2006-100901 and 2006-100902, the disclosure of which is incorporated herein by reference.

BACKGROUND OF THE INVENTION

1. Field of the Invention

The invention relates to a functional device, in particular, an organic electroluminescent device.

2. Description of the Related Art

In recent years, functional devices, in particular, organic electroluminescent devices have been developed.

In organic electroluminescent devices, a thin film material which receives the supply of an electric current so as to be excited, thereby emitting light is used. Since the electroluminescent devices give high-luminance light at a low voltage, the devices have wide latent usages in broad fields which include the fields of cellar phone displays, personal digital assistants (PDAs), computer displays, automobile data displays, TV monitors, and ordinary illuminations. In these fields, the electroluminescent devices have advantages of causing devices to be made thin, light, small-sized, low in consumption power, and so on. Accordingly, the electroluminescent devices are largely expected as the leading role in the market of electronic displays in the future. However, in order to use the electroluminescent devices practically instead of conventional displays in these fields, many technical improvements have been taken up as themes about light emission luminance, color tone, endurance in a wide use environment, cost decrease, mass-productivity, and others.

Organic electroluminescent devices as linear light sources have been desired. Disclosed are, for example, a white light source for liquid crystal backlight, an image sensor, or the like (see, Japanese Patent Application Laid-Open (JP-A) No. 2003-51380); and a linear organic electroluminescent device using a stripe electrode as a light source for scanning exposure, or image-reading (see, for example, JP-A No. 2005-260821). However, as the distance from the electrode terminal increases, a more voltage drop is caused so that the emission intensity becomes lower. Thus, the device has a problem that uniform luminance cannot be obtained. This problem is a basic problem to be much solved in the case of using surface emission.

Suggested is, for example, an attempt of making the thickness of an organic emitting layer larger as the distance from the terminal increases, so as to enhance light emission, thereby compensating for a drop in the emission intensity based on the above-mentioned voltage drop (see, for example, JP-A No. 11-40362). Alternatively, suggested is also an attempt of forming auxiliary wiring and supplying an electric current through the auxiliary wiring, to a light emission layer so as to make the electric current larger as the distance from the terminal increases in this device, thereby compensating for the voltage drop (see, for example, JP-A No. 2002-156633). However, any of these attempts makes the device structure thereof complicated, and is insufficient in practical device production suitability. Accordingly, a more practicable improvement is desired.

SUMMARY OF THE INVENTION

An object of the invention is to provide an improved functional device which is excellent in production suitability and can give a uniform in-plane output, in particular, such an improved organic electroluminescent device.

The object of the invention is attained by the following invention:

According to a first aspect of the invention, provided is a functional device, comprising, on a substrate, a pair of electrodes, a functional layer which is sandwiched between the electrodes and has an output that varies in accordance with an applied electric current, and a terminal arranged to apply an electric current to at least one of the electrodes, in which an insulator is arranged between the electrodes and the density of the insulator becomes gradually decreases as the distance from the terminal increase.

In this functional device, the insulator can form a discontinuous phase. In particular, it is preferred that in a layer comprising the insulator, the insulator forms a discontinuous phase and an electroconductive material forms a continuous phase.

Moreover, at least one of the electrodes can be formed as a stripe.

The functional device can be an organic electroluminescent device.

According to a second aspect of the invention, provided is a functional device, comprising, on a substrate, a pair of electrodes, a functional layer which is sandwiched between the electrodes and has an output that varies in accordance with an applied electric current, and a terminal arranged to apply an electric current to at least one of the electrodes, in which at least one of the electrodes has a notch section, and the ratio of the area of the notch section to the area of the electrode decreases as the distance from the terminal increases.

At least one of the electrodes can be formed as a stripe. Moreover, one of the electrodes can be formed as a stripe and the other can be planar, and further the notch section can be formed in the planar electrode.

In this functional device, a plurality of stripe-form electrodes can be arranged, and a plurality of notch sections can be arranged in the planar electrode so as to correspond to the plural arrangement of the stripe-form electrodes; or the notch section can be formed in the stripe-form electrode. Furthermore, a plurality of the notch sections may be arranged in the stripe-form electrodes.

The functional device can be an organic electroluminescent device.

According to the invention, provided is an improved functional device which is excellent in production suitability and can give a uniform in-plane output.

DETAILED DESCRIPTION OF THE INVENTION

First Embodiment

Figure 1A:
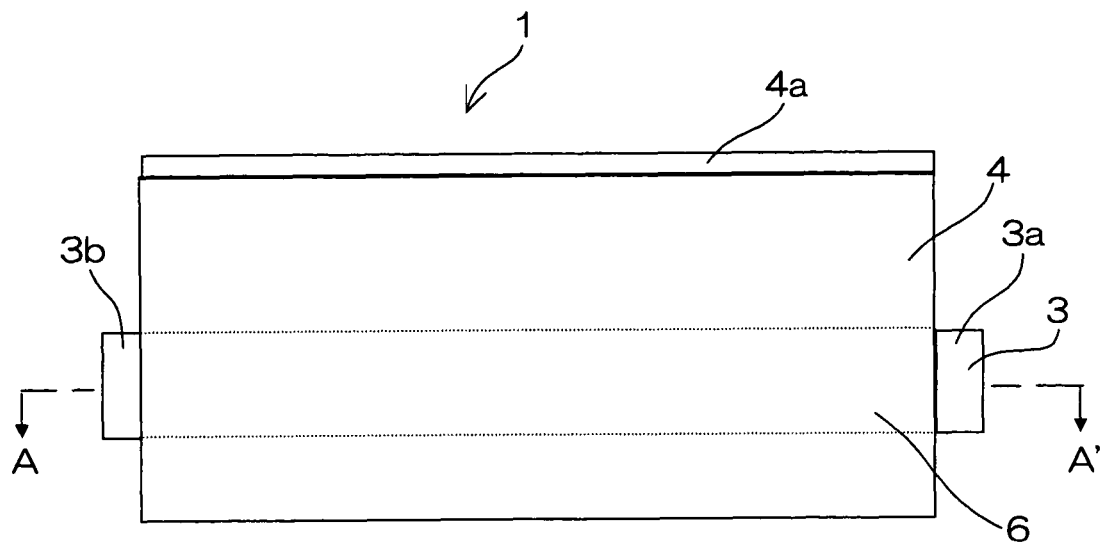
FIGS. 1A and 1B are each a schematic view of a functional device according to a first embodiment of the invention.

A first embodiment of the invention is a functional device comprising, on a substrate, a pair of electrodes, a functional layer which is sandwiched between the electrodes and has an output that varies in accordance with an applied electric current, and a terminal arranged to apply an electric current to at least one of the electrodes, in which an insulator is arranged between the electrodes and the density of the insulator becomes gradually decreases as the distance from the terminal increases. Preferably, the insulator forms a discontinuous phase between the electrodes. More preferably, the insulator is present as a layer comprising an electroconductive material which forms a continuous phase and the insulator which forms a discontinuous phase.

In the device according to the first embodiment of the invention, the distribution density of the insulator decreases as the distance from the terminal increases; therefore, this structure compensates for a voltage drop, so that a uniform current density can be obtained in the plane. Accordingly, an output function can be uniformly obtained.

In the case of, for example, a surface emission device, a uniform emission intensity can be obtained over the whole surface.

The layer comprising the insulator is a layer comprising an electroconductive material as a continuous phase and the insulator as a discontinuous phase. The means for forming the layer can be selected from means capable of producing the layer more easily such as varying the amount of the insulator in accordance with the distance by photolithography. Thus, the productivity is also excellent.

The layer comprising the insulator is a layer arranged between the electrodes, and at least one of the electrodes is preferably in a stripe form.

Preferably, the functional device is an organic electroluminescent device.

1. Insulator

The insulator in the invention is comprised between the electrodes, and forms a discontinuous phase. Furthermore, the insulator is distributed in such a manner that the density of the insulator becomes smaller from the vicinity of the terminal toward the direction farther from the terminal. Preferably, a continuous phase made of an electroconductive material and a discontinuous phase made of the insulator are formed.

Preferably, the layer comprising the insulator is arranged between the electrodes and the functional layer.

1) Insulator

<Description of the Material>

The insulator used in the invention is preferably an organic material or inorganic material having an electric resistance of $100\Omega$ or more. The insulator is more preferably an organic material or inorganic material having an electric resistance of several megaohms or more.

-Organic Material-

The organic material may be a known material that is used as an organic insulating material, and is preferably a photosensitive resin or a thermosetting resin. The resin is melted or dissolved into a solvent, applied, and cured by ultraviolet rays, visible rays or heating, thereby forming a film having a high physical strength.

The photosensitive resin or thermosetting resin is not particularly limited, and may be acrylic resin, epoxy resin or the like. In particular, epoxy resin is preferred from the viewpoint of the waterproof function thereof.

The method for forming the organic insulating layer is not particularly limited, and may be a method of applying a resin, and then patterning the resin into a predetermined pattern by photolithography, a method of using a dispenser to give a predetermined pattern, or the like.

-Inorganic Insulating Material-

The material of the inorganic insulating layer used in the invention is preferably selected from silicon nitride, silicon oxynitride, silicon oxide, and silicon carbide.

The inorganic insulating material layer used in the invention can be formed by CVD, ion plating, sputtering or vapor deposition.

<Density Distribution>

In a device having a functional layer, a voltage drop caused due to the shape of the functional device can be estimated when the distance from the electrode terminal, the electrode resistance, and the I-V characteristic of the functional device are known. An insulator with a density corresponding to the relative ratio of the voltage drop, therefore, may be formed between the electrodes in such a manner that the density of the insulator becomes lower as the voltage drop increases. When the density of the insulator is reduced as the distance from the terminal increases, it is possible to compensate for the current density distribution based on the voltage drop and make the in-plane output uniform. In the case of, for example, a surface emitting device, uniform emission intensity can be obtained over the whole surface.

Regarding the maximum density and the minimum density in the density distribution of the insulator, and the difference therebetween, as described above, a voltage drop caused due to the shape of the functional device can be estimated when the distance from the electrode terminal, the electrode resistance, and the I-V characteristic of the functional device are known; therefore, the density of the insulator is preferably set to correspond to the estimated voltage drop distribution. When the density distribution of the insulator is formed, it is preferable to form the density distribution by, for example, the following methods:

The distribution is formed by varying the number of portions of the insulator having the same area depending on the distance from the terminal.

The distribution is formed by varying the area of the insulator without varying the number of portions thereof.

The distribution is formed by varying both the number and the area of the insulator.

The thickness of the insulator is preferably substantially equal to or more than the thickness of organic layers to be layered.

2) Electroconductive Material

In the invention, it is preferred that the insulator is discontinuously distributed, an electroconductive material is embedded in gaps between the discontinuous phases of the insulator, and the electroconductive material forms a continuous phase. The electroconductive material used in the invention may be any material that is used in functional devices, and is preferably selected from organic materials and inorganic materials used in light emitting devices. The electroconductive material is more preferably an organic material or inorganic material having an electric resistance of several tens of ohms or less.

<Process for Forming the Electroconductive Material Layer>

The continuous phase made of the electroconductive material in the invention can be formed by an ordinary method for forming a functional layer of a functional device.

For example, a layer of the insulator is formed, and then the electroconductive material is deposited onto the insulating layer by means of vapor deposition or the like. In this way, the electroconductive material is deposited on the insulator, and embedded in gaps between the phases of the insulator, whereby the continuous phase can be formed.

Alternatively, the insulator and the electroconductive material are subjected to co-evaporation, and the ratio thereof is varied in accordance with the distance from the terminal, whereby the continuous phase can be formed.

2. Organic Electroluminescent Device

The organic electroluminescent device of the invention may have, besides an emitting layer, a hole transporting layer, an electron transporting layer, a blocking layer, an electron injecting layer, a hole injecting layer, and/or any other organic compound layer that is known in the prior art.

These layers will be described in detail hereinafter.

1) Layer Structure

<Electrodes>

In the pair of electrodes of the organic electroluminescent device of the invention, at least one of the electrodes is a transparent electrode, and the other may be transparent or nontransparent.

<Structure of the Organic Compound Layers>

The layer structure of the organic compound layers is not particularly limited, and can be appropriately selected in accordance with the usage and purpose of the organic electroluminescent device. The layer structure is preferably formed between the electrodes.

The shape, the size, the thickness and other properties of each of the organic compound layers are not particularly limited, and can be appropriately selected in accordance with the purpose.

Specific examples of the layer structure are listed below. However, in the invention, the layer structure is not limited to these structures.

Anode/hole transporting layer/emitting layer/electron transporting layer/cathode Anode/hole transporting layer/emitting layer/blocking layer/electron transporting layer/cathode Anode/hole transporting layer/emitting layer/blocking layer/electron transporting layer/electron injecting layer/cathode Anode/hole injecting layer/hole transporting layer/emitting layer/blocking layer/electron transporting layer/cathode Anode/hole injecting layer/hole transporting layer/emitting layer/blocking layer/electron transporting layer/electron injecting layer/cathode Each of the layers will be described in detail hereinafter.

2) Hole Transporting Layer

The hole transporting layer used in the invention comprises a hole transporting material. The hole transporting material is not particularly limited as long as the material is a material having either one of a function of transporting holes and a function of blocking electrons injected from the cathode. The hole transporting material used in the invention may be either one of a low molecular weight hole transporting material and a high molecular weight hole transporting material.

Specific examples of the hole transporting material used in the invention include materials described below.

Carbazole derivatives, triazole derivatives, oxazole derivatives, oxadiazole derivatives, imidazole derivatives, polyarylalkane derivatives, pyrazoline derivative, pyrazolone derivatives, phenylenediamine derivatives, arylamine derivatives, amino-substituted chalcone derivatives, styrylanthracene derivatives, fluorenone derivatives, hydrazone derivatives, stylbene derivatives, silazane derivatives, aromatic tertiary amine compounds, styrylamine compounds, aromatic dimethylidene compounds, porphyrin compounds, polysilane compounds, poly(N-vinylcarbazole)derivatives, aniline copolymers, thiophene oligomers, polythiophene and other electroconductive high molecular weight oligomers, polythiophene derivatives, polyphenylene derivatives, polyphenylene vinylene derivatives, polyfluorene derivatives, and other polymeric compounds.

These may be used alone or in combination of two or more thereof.

The thickness of the hole transporting layer is preferably from 10 to 200 nm, more preferably from 20 to 80 nm. If the thickness is more than 200 nm, the driving voltage may rise. If the thickness is less than 10 nm, the light emitting device may short-circuit. Thus, the range of 10 to 200 nm is preferred.

3) Hole Injecting Layer

In the invention, a hole injecting layer may be formed between the hole transporting layer and the anode.

The hole injecting layer is a layer making the injection of holes from the anode to the hole transporting layer easy. Specifically, the material thereof is preferably a material having a small ionization potential out of the above-mentioned hole transporting materials. Examples thereof include phthalocyanine compounds, porphyrin compounds, and star-burst triarylamine compounds. These can be preferably used.

The film thickness of the hole injecting layer is preferably from 1 to 30 nm.

4) Emitting Layer

The emitting layer used in the invention comprises at least one emitting material, and may contain a hole transporting material, an electron transporting material, and/or a host material if necessary.

The emitting material used in the invention is not particularly limited, and may be either one of a fluorescence emitting material and a phosphorescence emitting material. The phosphorescence emitting material is preferred from the viewpoint of emission efficiency.

Examples of the fluorescence emitting material include benzoxazole derivatives, benzimidazole derivatives, benzothiazole derivatives, styrylbenzene derivatives, polyphenyl derivatives, diphenylbutadiene derivatives, tetraphenylbutadiene derivatives, naphthalimide derivatives, coumalin derivatives, perylene derivatives, perynone derivatives, oxadiazole derivatives, aldazine derivatives, pyridine derivatives, cyclopentadiene derivatives, bisstyrylanthracene derivatives, quinacridon derivatives, pyrrolpyridine derivatives, thiadiazolopyridine derivatives, styrylamine derivative, aromatic dimethylidene compounds, various metal complexes, typical examples thereof including metal complexes or rare earth element complexes of an 8-quinolinol derivative, polythiophene derivatives, polyphenylene derivatives, polyphenylene vinylene derivatives, polyfluorene derivatives, and other polymeric compounds. These may be used alone or in the form of a mixture of two or more thereof.

The phosphorescence emitting material is not particularly limited, and is preferably an ortho-metallized metal complex or a porphyrin metal complex.

The ortho-metallized metal complex is a generic term of compounds described in, for example, Akio Yamamoto "Organometallic Chemistry—Basis and Application—", pp. 150-232, Shokabo Publishing Co., Ltd. (published in 1982), H. Yersin "Photochemistry and Photophysics of Coordination Compounds", pp. 71-77, pp. 135-146, Springer-Verlag Co. (published in 1987), and others. It is advantageous to use the ortho-metallized metal complex as an emitting material in the emitting layer since the complex gives a high luminance and an excellent emission efficiency.

The ligand which forms the ortho-metallized metal complex may be selected from various ligands, and such ligands are described in the above-mentioned documents. Preferred examples thereof include 2-phenylpyridine derivatives, 7,8-benzoquinoline derivatives, 2-(2-thienyl)pyridine derivatives, 2-(1-naphthyl)pyridine derivatives, and 2-phenylquinoline derivatives. These derivatives may have a substituent if necessary. The ortho-metallized metal complex may have a ligand other than the above-mentioned ligands.

The ortho-metallized metal complex used in the invention can be synthesized by various known methods described in Inorg Chem., vol. 30, 1685 (1991), Inorg Chem., vol. 27, 3464 (1988), Inorg Chem., vol. 33, 545 (1994), Inorg. Chim. Acta, vol. 181, 245 (1991), Organomet. Chem., vol. 335, 293 (1987), J. Am. Chem. Soc. vol. 107, 1431 (1985), and others.

Of the above-mentioned ortho-metallized complexes, compounds which emit light from their triplet excitons can be preferably used in the invention from the viewpoint of an improvement in emission efficiency.

Of the porphyrin metal complexes, a porphyrin platinum complex is preferred.

In the phosphorescence emitting material, only one species thereof may be used or two or more species thereof may used together. The fluorescence emitting material and the phosphorescence emitting material may be used at the same time.

The host material is a material having a function of causing energy shift from an excited state thereof to the fluorescence emitting material or phosphorescence emitting material so as to cause the fluorescence emitting material or the phosphorescence emitting material to emit light.

The host material is not particularly limited as long as the material is a compound having a function of shifting exciton energy to the emitting material, a function of preventing the association of the emitting material and so on. The host material can be appropriately selected in accordance with the purpose. Specific examples thereof include carbazole derivatives, triazole derivatives, oxazole derivatives, oxadiazole derivatives, imidazole derivatives, polyarylalkane derivatives, pyrazoline derivatives, pyrazolone derivatives, phenylenediamine derivatives, arylamine derivatives, amino-substituted chalcone derivatives, styrylanthracene derivatives, fluorenone derivatives, hydrazone derivatives, stylbene derivatives, silazane derivatives, aromatic tertiary amine compounds, styrylamine compounds, aromatic dimethylidene compounds, porphyrin compounds, anthraquinodimethane derivatives, anthrone derivatives, diphenylquinone derivatives, thiopyrandioxide derivatives, carbodiimide derivatives, fluorenylidenemethane derivatives, distyrylpyrazine derivatives, heterocyclic tetracarboxylic acid anhydrides such as naphthaleneperylene, phthalocyanine derivatives, various metal complexes, typical examples thereof including metal complexes of an 8-quinolinol derivative and a metal complex having, as a ligand, metal phthalocyanine, benzoxazole or benzothiazole, polysilane compounds, poly(N-vinylcarbazole) derivatives, aniline copolymers, thiophene oligomers, polythiophene and other electroconductive high molecular weight oligomers, polythiophene derivatives, polyphenylene derivatives, polyphenylene vinylene derivatives, polyfluorene derivatives, and other polymeric compounds. These compounds may be used alone or in combination of two or more thereof.

The content by percentage of the host material in the emitting layer is preferably from 0 to 99.9% by mass, more preferably from 0 to 99.0% by mass.

5) Blocking Layer

In the invention, a blocking layer can be formed between the emitting layer and the electron transporting layer. The blocking layer is a layer for restraining the diffusion of excitons generated in the emitting layer, and is also a layer for restraining holes from penetrating toward the side of the cathode.

The material used in the blocking layer is not particularly limited as long as the material is a material capable of receiving electrons from the electron transporting layer and transferring the electrons to the emitting layer. The material may be an ordinary electron transporting material. Examples of the material include the following: triazole derivatives, oxazole derivatives, oxadiazole derivatives, fluorenone derivatives, anthraquinodimethane derivatives, anthrone derivatives, diphenylquinone derivatives, thiopyrandioxide derivatives, carbodiimide derivatives, fluorenylidenemethane derivatives, distyrylpyrazine derivatives, heterocyclic tetracarboxylic acid anhydrides such as naphthaleneperylene, phthalocyanine derivatives, various metal complexes, typical examples thereof including metal complexes of an 8-quinolinol derivative and a metal complex having, as a ligand, metal phthalocyanine, benzoxazole or benzothiazole, aniline copolymers, thiophene oligomers, polythiophene and other electroconductive high molecular weight oligomers, polythiophene derivatives, polyphenylene derivatives, polyphenylene vinylene derivatives, polyfluorene derivatives, and other polymeric compounds. These compounds may be used alone or in combination of two or more thereof.

6) Electron Transporting Layer

In the invention, an electron transporting layer comprising an electron transporting material can be formed.

The electron transporting material is not limited as long as the material has either one of a function of transporting electrons, or a function of blocking holes injected from the anode. The material can be preferably selected from the electron transporting materials mentioned in the description of the above-mentioned blocking layer.

The thickness of the electron transporting layer is preferably from 10 to 200 nm, more preferably from 20 to 80 nm.

If the thickness is more than 200 nm, the driving voltage may rise. If the thickness is less than 10 nm, the light emitting device may short-circuit. Thus, the range of 10 to 200 nm is preferred.

7) Electron Injecting Layer

In the invention, an electron injecting layer can be formed between the electron transporting layer and the cathode.

The electron injecting layer is a layer for making the injection of electrons from the cathode to the electron transporting layer easy. Specific examples of the material of this layer include lithium salts such as lithium fluoride, lithium chloride, and lithium bromide; alkali metal salts such as sodium fluoride, sodium chloride, and cesium fluoride; and insulating metal oxides such as lithium oxide, aluminum oxide, indium oxide, and magnesium oxide.

The thickness of the electron injecting layer is preferably from 0.1 to 5 nm.

8) Method for Forming the Organic Compound Layers

The above-mentioned organic compound layers can be preferably formed by either one of a dry deposition method such as vapor deposition or sputtering, and a wet deposition method such as a dipping, spin coating, dip coating, casting, die coating, roll coating, bar coating, or gravure coating method.

The dry coating method is particularly preferred from the viewpoint of the emission efficiency and endurance of the resultant layer.

The following will describe the substrate and the electrodes used in the organic electroluminescent device of the invention.

9) Substrate

The material of the substrate used in the invention is preferably a material into which no water permeates, or a material which has a very low water permeability. Moreover, the material is preferably a material which does not cause light emitted from the emitting layer to be scattered, attenuated or the like. Specific examples thereof include inorganic materials, such as YSZ (zirconium-stabilized yttrium), and glass; and organic materials, such as polyesters, for example, polyethylene terephthalate, polybutylene terephthalate and polyethylene naphthalate, polystyrene, polycarbonate, polyethersulfone, polyarylate, allyl diglycol carbonate, polyimide, polycycloolefin, norbornene resin, poly(chlorotrifluoroethylene), and other synthetic resins.

In the case of the organic materials, it is preferred that the materials are excellent in heat resistance, dimension stability, solvent resistance, electrical insulation properties, workability, low gas-permeability, low hygroscopicity, and others. In the case that the material of the above-mentioned transparent electrode is indium tin oxide (ITO), which is suitably used as the material of the transparent electrode, preferred is an organic material which has a lattice constant exhibiting a small difference from that of indium tin oxide (ITO). These organic materials may be used alone or in combination of two or more thereof.

The shape, the structure, the size and other properties of the substrate are not particularly limited, and can be appropriately selected in accordance with the usage or the purpose of the light emitting device, and others. In general, the shape is a plate form. The structure may have a mono-layered structure or a laminated structure, and may be made of a single member or two or more members.

The substrate may be transparent and colorless, or transparent and colored, and is preferably transparent and colorless since light emitted from the emitting layer is not scattered, attenuated, or the like.

It is preferred to form a moistureproof layer (gas barrier layer) on the front face of the substrate or the rear face thereof (on the transparent electrode side face of the substrate). The material of the moistureproof layer (gas barrier layer) is preferably an inorganic material such as silicon nitride, or silicon oxide. The moistureproof layer (gas barrier layer) can be formed by, for example, high-frequency sputtering or the like.

If necessary, a hard coat layer, an undercoat layer and so on can be formed on the substrate.

10) Anode

The anode used in the invention should usually have a function as an anode for supplying holes to the organic compound layers. The shape, the structure, the size and other properties thereof are not particularly limited. Thus, the anode can be appropriately selected from known electrodes in accordance with the usage and purpose of the light emitting device.

Examples of the material of the anode include metals, alloys, metal oxides, and organic electroconductive compounds, and mixtures thereof. A material having a work function of 4.0 eV or more is preferred. Specific examples thereof include semiconductive metal oxide such as tin oxide doped with antimony or fluorine (ATO and FTO), tin oxide, zinc oxide, indium oxide, indium tin oxide (ITO), and indium zinc oxide (IZO); metals such as gold, silver, chromium, and nickel; mixtures or laminates each made of one or more of these metals and one or more of electroconductive metal oxides; inorganic electroconductive materials such as copper iodide and copper sulfide; organic electroconductive materials such as polyaniline, polythiophene, and polypyrrole; and laminates each made of one or more of these and ITO.

The anode can be formed on the substrate by a method selected appropriately from wet methods such as printing and coating methods, and physical methods such as vacuum deposition, sputtering and ion plating, chemical methods such as CVD and plasma CVD, and other methods, considering the suitability for the selected material(s). In the case of using, for example, ITO as the material of the anode, the anode can be formed by DC or high-frequency sputtering, vacuum deposition, ion plating or the like. In the case of selecting one of the organic electroconductive compounds, the anode can be formed by a wet deposition method.

In the light emitting device, the position where the anode is formed is not particularly limited, and can be appropriately selected in accordance with the usage and purpose of the light emitting device. The anode is preferably formed on the substrate. In this case, the anode may be formed on the whole of one of the surfaces of the substrate or may be partially formed thereon.

The patterning of the anode may be conducted in a chemical etching manner such as photolithography, or a physical etching manner such as laser etching. The patterning may be conducted by vacuum deposition or sputtering using a mask, a lift off method or a printing method.

The thickness of the anode can be appropriately selected in accordance with the selected material thereof. The thickness, which is not specified without reservation, is usually from 10 nm to 50 μm, preferably from 50 nm to 20 μm.

The resistance of the anode is preferably $10^3$ Ω/□ or less, more preferably $10^2$ Ω/□ or less.

The anode may be transparent and colorless, or transparent and colored. In order to take out light from the side of the anode, the transmittance thereof is preferably 60% or more, more preferably 70% or more. This transmittance can be measured in accordance with a known method using a spectrophotometer.

Regarding anodes, details thereof are described in "New Development of Transparent Electrode Film", supervised by Yutaka Sawada, published by CMC (1999), and the description can be applied to the invention. In the case of using a plastic substrate having a low heat resistance, preferred is an anode obtained by making ITO or IZO into a film form at a low temperature of 150° C. or lower.

11) Cathode

The cathode which can be used in the invention should usually have a function as an cathode for injecting electrons to the organic compound layers. The shape, the structure, the size and other properties thereof are not particularly limited, and can be appropriately selected from known electrodes in accordance with the usage and purpose of the light emitting device.

Examples of the material of the cathode include metals, alloys, metal oxides, and organic electroconductive compounds, and mixtures thereof. A material having a work function of 4.5 eV or less is preferred. Specific examples thereof include alkali metals (for example, Li, Na, K, Cs and the like), alkaline earth metals (for example, Mg, Ca and the like), gold, silver, lead, aluminum, sodium-potassium alloy, lithium-aluminum alloy, magnesium-silver alloy, indium, and rare earth metals such as ytterbium. These may be used alone. In order to make the stability and electron injecting performance of the cathode compatible with each other, two or more thereof are preferably used together.

Of these examples, alkali metals and alkaline earth metals are preferred from the viewpoint of electron injecting performance. A material made mainly of aluminum is particularly preferred since the material is excellent in storage stability. The material made mainly of aluminum is aluminum alone, or an alloy or mixture composed of aluminum and 0.01 to 10% by mass of an alkali metal or alkaline earth metal (for example, lithium-aluminum alloy, magnesium-aluminum alloy, and the like).

Regarding the material of cathodes, details are described in JP-A Nos. 2-15595 and 5-12117. The description can be applied to the invention.

The method for forming the cathode is not particularly limited, and thus the cathode can be formed by any known method. For example, the cathode can be formed on the substrate by a method selected appropriately from wet methods such as printing and coating methods, and physical methods such as vacuum deposition, sputtering and ion plating, chemical methods such as CVD and plasma CVD, and other methods, considering the suitability for the selected material(s). In the case of using, for example, metal or the like as the material of the cathode, the cathode can be formed by sputtering one or more species of the material simultaneously or successively.

The patterning of the cathode may be conducted in a chemical etching manner such as photolithography, or a physical etching manner such as laser etching. The patterning may be conducted by vacuum deposition or sputtering using a mask, or by a lift off method or a printing method.

In the organic electroluminescent device, the position where the cathode is formed is not particularly limited, and can be appropriately selected in accordance with the usage and purpose of the light emitting device. The cathode is preferably formed on the organic compound layer. In this case, the cathode may be formed on the whole of the organic compound layer or may be partially formed thereon.

A dielectric layer made of a fluoride of an alkali metal or alkaline earth metal and having a thickness of 0.1 to 5 nm may be formed between the cathode and the organic compound layers.

The dielectric layer can be formed by, for example, vacuum deposition, sputtering, ion plating or the like.

The thickness of the cathode can be appropriately selected in accordance with the selected material. The thickness, which is not specified without reservation, is usually from 10 nm to 5 μm, preferably from 50 nm to 1 μm.

The cathode may be transparent or nontransparent. The transparent cathode can be formed by forming the material of the cathode into the form of a thin film having a thickness of 1 to 10 nm and further layering a transparent electroconductive material such as ITO or IZO.

3. Device Structure

With the reference to the attached drawings, the structure of the device of the invention will be described hereinafter.

Figure 1B:
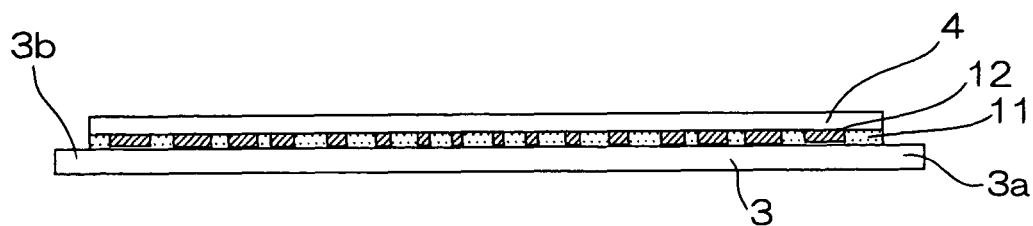

FIGS. 1A and 1B are each a schematic view showing an example of the functional device according to the first embodiment of the invention. FIG. 1A is a schematic plane view thereof, and FIG. 1B is a schematic sectional view taken along line A-A' in FIG. 1A. FIGS. 1A and 1B are each a schematic view for explaining the function of the functional device of the invention; therefore, members which are not related directly to the explanation of the function, such as a substrate, and a protective layer for sealing or the like, are omitted.

An anode 3 is arranged into a stripe form on a substrate. The anode 3 has terminals 3a and 3b. An insulator 12 is discontinuously arranged on the anode. The insulator is also arranged in such a manner that the density of the insulator decreases as the distance increases from each of the anode terminals 3a and 3b at either end of the device.

An electroconductive material 11 is formed between the anode 3 and a cathode 4. Gaps in the insulator 12 are filled with the electroconductive material 11, so that the material 11 forms a continuous phase. Numeral 4a indicates the cathode terminal. Light is emitted in a light emitting region 6 sandwiched between the stripe-form anode 3 and the cathode 4 when a voltage is applied to both of the electrodes.

Figure 2:
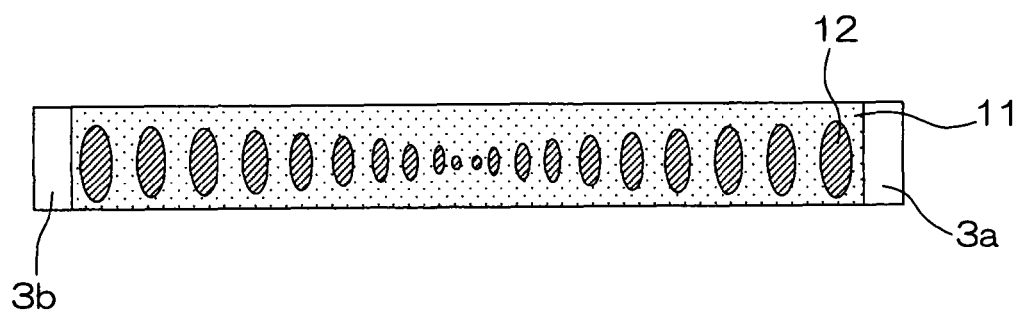
FIG. 2 is a schematic view showing one density pattern of an insulator on a cathode electrode.

FIG. 2 is a schematic view showing a density pattern of the insulator arranged on the stripe-form anode in the functional device of the invention. The insulator 12 is discontinuously arranged on the anode 3 except at the terminals 3a and 3b. The density of the insulator decreases as the distance increases from each of the terminals 3a and 3b. Parts of the insulator are each represented as an ellipse. The ellipse and the size thereof schematically show the value of the density of the insulator. Thus, the shape of the parts of the insulator is not particularly limited in the invention. The shape may be not only circular or elliptical, but also square or rectangular, or may be any geometrical shape or an indeterminate shape. Corresponding to the voltage drop distribution estimated from the voltage drop caused due to the distance from the electrode terminal, the electrode resistance, the I-V characteristic of the functional device, and the shape of the functional device, the insulator density is reduced as the voltage drop increases.

The gaps in the insulator 12 are filled with the electroconductive material 11, and the electroconductive material forms a continuous phase.

Figure 3:
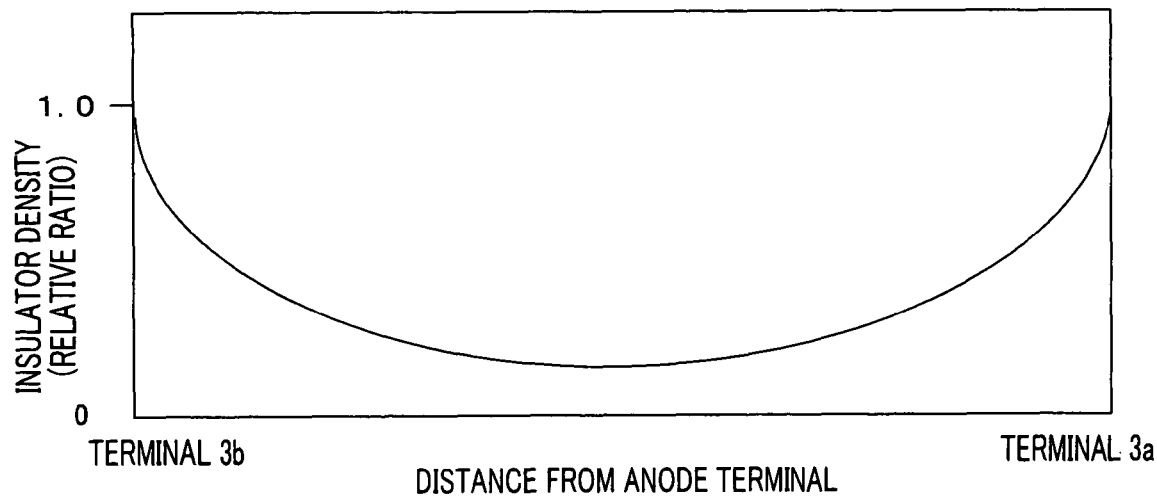
FIG. 3 is a schematic view showing a relationship between the distance from an anode terminal and the ratio of density of an insulator in a functional device.

FIG. 3 is a schematic view showing a relationship between the distance from the anode terminals of the functional device having the insulator density pattern shown in FIG. 2 and the relative density (relative ratio) of the insulator.

The left end and the right end of the transverse axis correspond to the terminals 3b and 3a, respectively. The vertical axis represents the relative density when the insulator density at each of the terminals is regarded as 1.0.

Figure 4:
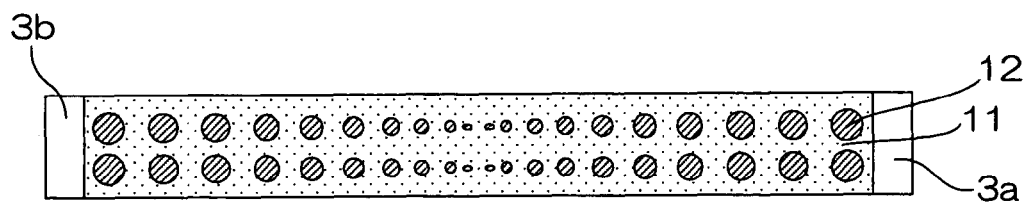
FIG. 4 is a schematic view showing another density pattern of the insulator.

FIG. 4 is a schematic view showing another density pattern of the insulator. Insulator density distributions of two lines are arranged on the stripe-form anode.

Figure 5:
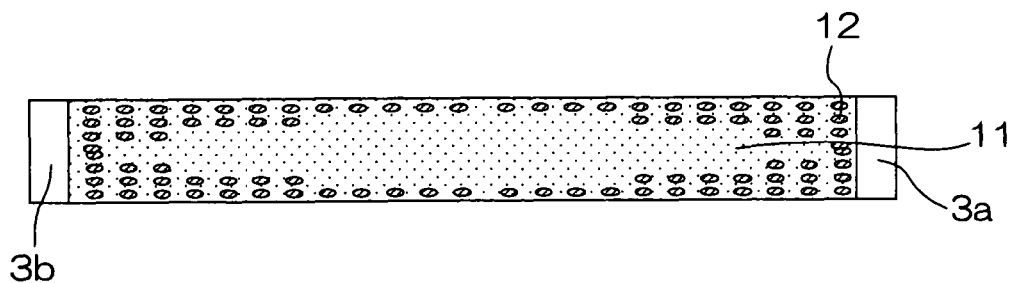
FIG. 5 is a schematic view showing still another density pattern of the insulator.

FIG. 5 is a schematic view showing another density pattern of the insulator. Insulator density distributions of plural lines are formed on the stripe-form anode.

The views shown herein are examples of the insulator density distribution, and the distribution is not particularly limited to the above.

(Resin Sealing Layer)

It is preferred in functional device of the invention that a resin sealing layer restrains the performance of the device from being deteriorated by oxygen or water content due to contact of the device with the air.

<Material>

The resin material of the resin sealing layer is not particularly limited, and may be acrylic resin, epoxy resin, fluororesin, silicone resin, rubber resin, ester resin, or the like. Of these, epoxy resin is preferred from the viewpoint of the waterproof function thereof. Of species of epoxy resin, thermosetting epoxy resin or photo-curing epoxy resin is preferred.

<Method for Forming the Layer>

The method for forming the resin sealing layer is not particularly limited, and is, for example, a method of applying a resin solution, a method of subjecting a resin sheet to compression bonding or thermocompression bonding, or a method of conducting dry polymerization by vapor deposition, sputtering or the like.

<Film Thickness>

The thickness of the resin sealing layer is preferably 1 μm or more and 1 mm or less, more preferably 5 μm or more and 100 μm or less, most preferably 10 μm or more and 50 μm or less. If the thickness is less than 1 μm, the above-mentioned inorganic film may be damaged when a second substrate is fitted to the organic compound layers. If the thickness is more than 1 mm, the thickness of the electroluminescent device itself becomes large so that the thin film property which is a characteristic of the organic electroluminescent device may be damaged.

(Sealing Adhesive)

In the invention, a sealing adhesive is used, and the adhesive has a function of preventing water or oxygen from invading the device through its end portion.

<Material>

The material of the sealing adhesive may be the same as used for the resin sealing layer. From the viewpoint of waterproofing, an epoxy adhesive is preferred, and a photo-curing epoxy adhesive is particularly preferred.

It is also preferred to add a filler to the above-mentioned material.

The filler added to the sealer is preferably an inorganic material such as $SiO_2$, SiO (silicon oxide), SiON (silicon oxynitride), or SiN (silicon nitride). The addition of the filler makes the viscosity of the sealing adhesive high so as to improve the workability and humidity resistance.

<Drying Agent>

The sealing adhesive may contain a drying agent. The drying agent is preferably barium oxide, calcium oxide, or strontium oxide.

The amount of the drying agent is preferably 0.01% or more and 20% or less by mass of the sealing adhesive, more preferably 0.05% or more and 15% or less by mass thereof. If the amount is less than 0.01% by mass, the addition effect of the drying agent becomes small. If the amount is more than 20% by mass, the drying agent may not be uniformly dispersed into the sealing adhesive with ease. Thus, the range of 0.01 to 20% by mass is preferred.

<Formulation of the Sealing Adhesive>

Polymer Composition and Concentration:

The sealing adhesive is not particularly limited, and may be composed of the above-mentioned materials. An example of the photo-curing epoxy adhesive is a product (trade name: XNR 5516) manufactured by Nagese ChemteX Corp. The sealing adhesive can be prepared by adding thereto the above-mentioned drying agent and then dispersing the agent therein.

Thickness:

The thickness of the applied sealing adhesive is preferably 1 μm or more and 1 mm or less. If the thickness is less than 1 μm, the sealing adhesive may not be uniformly applied. If the thickness is more than 1 mm, routes through which water penetrates may become broad. Thus, the thickness is preferably from 1 μm to 1 mm.

<Sealing Method>

In the invention, the sealing adhesive containing the drying agent is applied in an arbitrary amount with a dispenser or the like, and subsequently a second substrate is overlapped with the resultant. The sealing adhesive is then cured, thereby yielding a functional device of the invention.

Second Embodiment

The functional device according to the second embodiment of the invention is a functional device comprising, on a substrate, a pair of electrodes, a functional layer which is sandwiched between the electrodes and has an output that varies in accordance with an applied electric current, and a terminal arranged to apply an electric current to at least one of the electrodes, in which at least one of the electrodes has a notch section, and the ratio of the area of the notch section to the area of the electrode decreases as the distance from the terminal increases. The shape of the functional device is not particularly limited as long as the functional device is a functional device affected by a voltage drop between the electrodes and the functional layer. When the distance from the terminal, the electrode resistance, and the I-V characteristic of the functional device are known, a voltage drop caused due to the shape of the functional device can be estimated. Thus, the notch section can be formed corresponding to the relative ratio of the voltage drop.

In the device of the invention, the area of at least one of the electrodes increases as the distance from the terminal increases; therefore, it is possible to compensate for the current density distribution based on the voltage drop to give a uniform in-plane output. In the case of, for example, a surface emission device, a uniform emission intensity can be obtained over the whole of the surface thereof.

This advantage can be obtained only by making the notch section in the electrode. For example, the functional device can easily be produced by performing partial masking when the electrode is formed by vapor deposition or the like. Thus, the invention is also excellent in productivity.

Preferably, the functional layer has a multi-layered structure and at least one of the layers is an emitting layer. The functional device is preferably an organic electroluminescent device.

1. Organic Electroluminescent Device

The organic electroluminescent device of the invention may comprise one or more known organic compound layers such as a hole transporting layer, an electron transporting layer, a blocking layer, an electron injecting layer, and a hole injecting layer besides the emitting layer.

The device will be described in detail hereinafter.

1) Layer Structure

<Electrodes>

Regarding the pair of electrodes of the organic electroluminescent device of the invention, at least one thereof is a transparent electrode and the other may be transparent or nontransparent.

<Structure of the Organic Compound Layers>

The layer structure of the organic compound layers is not particularly limited, and can be appropriately selected in accordance with the usage and purpose of the organic electroluminescent device. The layer structure is preferably formed between the electrodes. The shape, the size, the thickness and other properties of each of the organic compound layers are not particularly limited, and can be appropriately selected in accordance with the purpose.

In the second embodiment, its hole transporting layer, hole injecting layer, emitting layer, blocking layer, electron transporting layer, electron injecting layer, method for forming the organic compound layers, and its substrate are the same as in the above-mentioned items 2) to 9) about the first embodiment. Thus, description thereof is omitted herein.

10) Anode

The anode used in the second embodiment of the invention usually has a function as an anode for supplying holes to the organic compound layers. In the case of making the notch section in the anode, a voltage drop caused due to the shape of the functional device is estimated from the distance from the terminal, the electrode resistance and the I-V characteristic of the functional device. Corresponding to the relative ratio of the voltage drop, the notch section is made. The method for making the notch section can be appropriately selected, as described below.

Examples of the material of the anode include metals, alloys, metal oxides, and organic electroconductive compounds, and mixtures thereof. A material having a work function of 4.0 eV or more is preferred. Specific examples thereof include semiconductive metal oxide such as tin oxide doped with antimony or fluorine (ATO and FTO), tin oxide, zinc oxide, indium oxide, indium tin oxide (ITO), and indium zinc oxide (IZO); metals such as gold, silver, chromium, and nickel; mixtures or laminates each made of one or more of these metals and one or more of electroconductive metal oxides; inorganic electroconductive materials such as copper iodide and copper sulfide; organic electroconductive materials such as polyaniline, polythiophene, and polypyrrole; and laminates each made of one or more of these and ITO.

The anode can be formed on the substrate by a method selected appropriately from wet methods such as printing and coating methods, and physical methods such as vacuum deposition, sputtering and ion plating, chemical methods such as CVD and plasma CVD, and other methods, considering the suitability for the selected material(s). In the case of using, for example, ITO as the material of the anode, the anode can be formed by DC or high-frequency sputtering, vacuum deposition, ion plating or the like. In the case of selecting one of the organic electroconductive compounds, the anode can be formed by a wet deposition method.

In the light emitting device, the position where the anode is formed is not particularly limited, and can be appropriately selected in accordance with the usage and purpose of the light emitting device. The anode is preferably formed on the substrate. In this case, the anode may be formed on the whole of one of the surfaces of the substrate or may be partially formed thereon.

In the patterning of the anode, a voltage drop caused due to the shape of the functional device is estimated from the distance from the terminal, the electrode resistance and the I-V characteristic of the functional device. Corresponding to the relative ratio of the voltage drop, the area of the electrode is calculated and then the notch section is made. Specifically, the patterning may be conducted in a chemical etching manner such as photolithography, or a physical etching manner such as laser etching. The patterning may be conducted by vacuum deposition or sputtering using a mask, or by a lift off method or a printing method.

The thickness of the anode can be appropriately selected in accordance with the selected material. The thickness, which is not specified without reservation, is usually from 10 nm to 50 μm, preferably from 50 nm to 20 μm.

The resistance of the anode is preferably $10^3$ Ω/□ or less, more preferably $10^2$ Ω/□ or less.

The anode may be transparent and colorless, or transparent and colored. In order to take out light from the side of the anode, the transmittance thereof is preferably 60% or more, more preferably 70% or more. This transmittance can be measured in accordance with a known method using a spectrophotometer.

Regarding anodes, details thereof are described in "New Development of Transparent Electrode Film", supervised by Yutaka Sawada, published by CMC (1999), and the description can be applied to the invention. In the case of using a plastic substrate having a low heat resistance, preferred is an anode obtained by making ITO or IZO into a film form at a low temperature of 150° C. or lower.

11) Cathode

The cathode which can be used in the invention usually has a function of injecting electrons to the organic compound layers. In the case of making the notch section in the cathode, a voltage drop caused due to the shape of the functional device is estimated from the distance from the terminal, the electrode resistance and the I-V characteristic of the functional device. Corresponding to the relative ratio of the voltage drop, the notch section is made. The method for making the notch section can be appropriately selected, as described below.

Examples of the material of the cathode include metals, alloys, metal oxides, and organic electroconductive compounds, and mixtures thereof. A material having a work function of 4.5 eV or less is preferred. Specific examples thereof include alkali metals (for example, Li, Na, K, Cs and the like), alkaline earth metals (for example, Mg, Ca and the like), gold, silver, lead, aluminum, sodium-potassium alloy, lithium-aluminum alloy, magnesium-silver alloy, and rare earth metals such as indium and ytterbium. These may be used alone. In order to make the stability and electron injecting performance of the cathode compatible with each other, two or more thereof are preferably used together.

Of these examples, alkali metals and alkaline earth metals are preferred from the viewpoint of electron injecting performance. A material made mainly of aluminum is particularly preferred since the material is excellent in storage stability. The material made mainly of aluminum is aluminum alone, or an alloy or mixture composed of aluminum and 0.01 to 10% by mass of an alkali metal or alkaline earth metal (for example, lithium-aluminum alloy, magnesium-aluminum alloy, and the like).

Regarding the material of cathodes, details are described in JP-A Nos. 2-15595 and 5-12117. The description can be applied to the invention.

The method for forming the cathode is not particularly limited, and thus the cathode can be formed by any known method. For example, the cathode can be formed on the substrate by a method selected appropriately from wet methods such as printing and coating methods, and physical methods such as vacuum deposition, sputtering and ion plating, chemical methods such as CVD and plasma CVD, and other methods, considering the suitability for the selected material(s). In the case of using, for example, metal or the like as the material of the cathode, the cathode can be formed by sputtering one or more species of the material simultaneously or successively.

In the patterning of the cathode, a voltage drop caused due to the shape of the functional device is estimated from the distance from the terminal, the electrode resistance and the I-V characteristic of the functional device. Corresponding to the relative ratio of the voltage drop, the area of the electrode is calculated and then the notch section is made. Specifically, the patterning may be conducted in a chemical etching manner such as photolithography, or a physical etching manner such as laser etching. The patterning may be conducted by vacuum deposition or sputtering using a mask, or by a lift off method or a printing method.

In the organic electroluminescent device, the position where the cathode is formed is not particularly limited, and may be appropriately selected in accordance with the usage and purpose of this device. The cathode is preferably formed on the organic compound layers. In this case, the cathode may be formed on the whole of the organic compound layers, or may be partially formed thereon.

A dielectric layer made of a fluoride of an alkali metal or alkaline earth metal and having a thickness of 0.1 to 5 nm may be formed between the cathode and the organic compound layers.

The dielectric layer can be formed by, for example, vacuum deposition, sputtering, ion plating or the like.

The thickness of the cathode can be appropriately selected in accordance with the selected material. The thickness, which is not specified without reservation, is usually from 10 nm to 5 μm, preferably from 50 nm to 1 μm.

The cathode may be transparent or nontransparent. The transparent cathode can be formed by forming the material of the cathode into the form of a thin film having a thickness of 1 to 10 nm and further layering a transparent electroconductive material such as ITO or IZO.

2. Structure of the Notch Section

With reference to the attached drawings, the structure of the device of the invention will be described hereinafter.

Figure 8A:
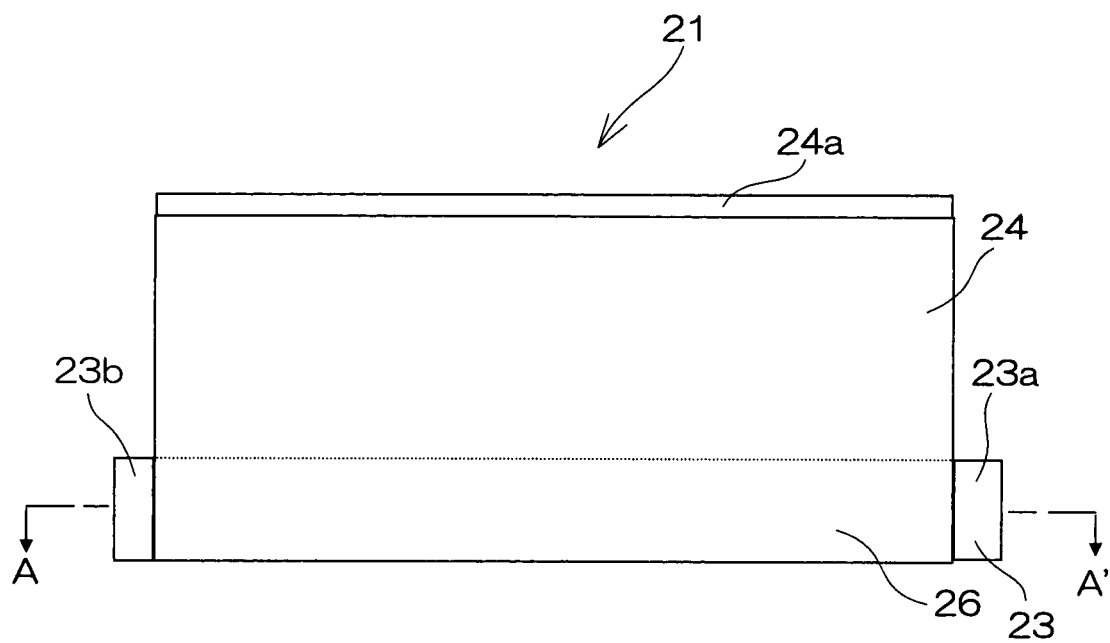
FIGS. 8A and 8B are each a schematic view of a functional device according to a second embodiment of the invention.
Figure 8B:
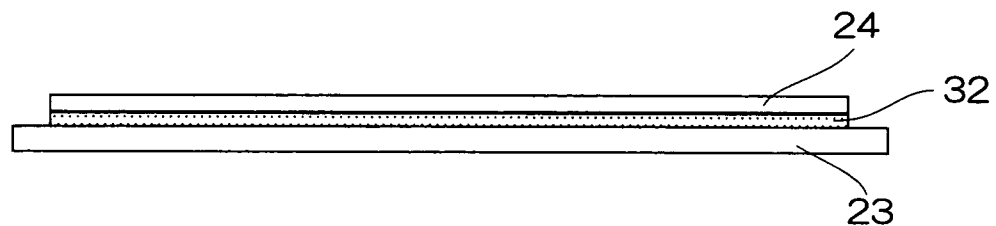

FIGS. 8A and 8B are each a schematic view showing an example of the functional device according to the second embodiment of the invention. FIG. 8A is a schematic plane view thereof, and FIG. 8B is a schematic view taken along line A-A' in FIG. 8A. FIGS. 8A and 8B are each a schematic view for explaining the function of the functional device of the invention; thus, its members which are not related directly to the explanation of the function, such as its substrate, and its protective layer for sealing or the like, are omitted.

An anode 23 is arranged into a stripe form on a substrate. The anode 23 has terminals 23a and 23b. A notch section is made in the anode. The notch section is arranged in such a manner that the area of the notch section decreases as the distance from each of the anode terminals at both ends of the device increases.

A functional layer 32 is formed between the anode 23 and the cathode 24. Numeral 24a indicates the cathode terminal. Light is emitted in a light emitting region 26 sandwiched between the stripe-form anode 23 and the cathode 24 when a voltage is applied to both of the electrodes.

Figure 9:
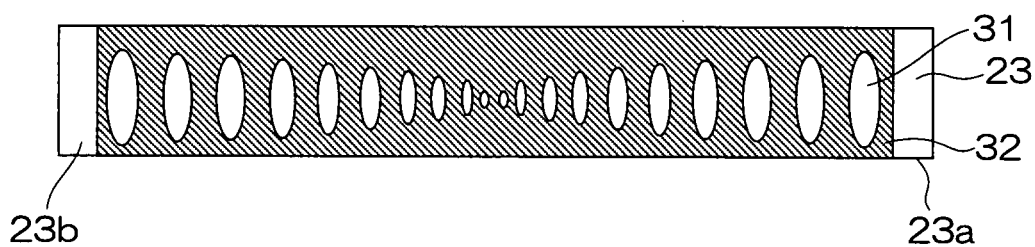
FIG. 9 is a schematic view showing a pattern wherein a notch section is formed in an anode electrode.

FIG. 9 is a schematic view showing an area pattern of the notch section arranged in the stripe-form anode of the functional device of the invention. A notch section 31 is discontinuously arranged in the anode 23 except at the terminals 23a and 23b. The area ratio of the notch section decreases as the distance increases from each of the terminals. The notch section area ratio is the ratio of the notch section area to the electrode area. Notches of the notch section are each represented as an ellipse. This ellipse and the size thereof schematically show the size of the area of the notch. Thus, the shape of the notches in the invention is not limited thereto.

Corresponding to the voltage drop distribution estimated from a voltage drop caused due to the distance from the electrode terminal, the electrode resistance, the I-V characteristic of the functional device, and the shape of the functional device, the notch section area is reduced as the voltage drop increases.

Gaps between the notches of the notch section are filled with the functional layer 32, which is electroconductive, and the electroconductive functional layer 32 forms a continuous phase.

Figure 10:
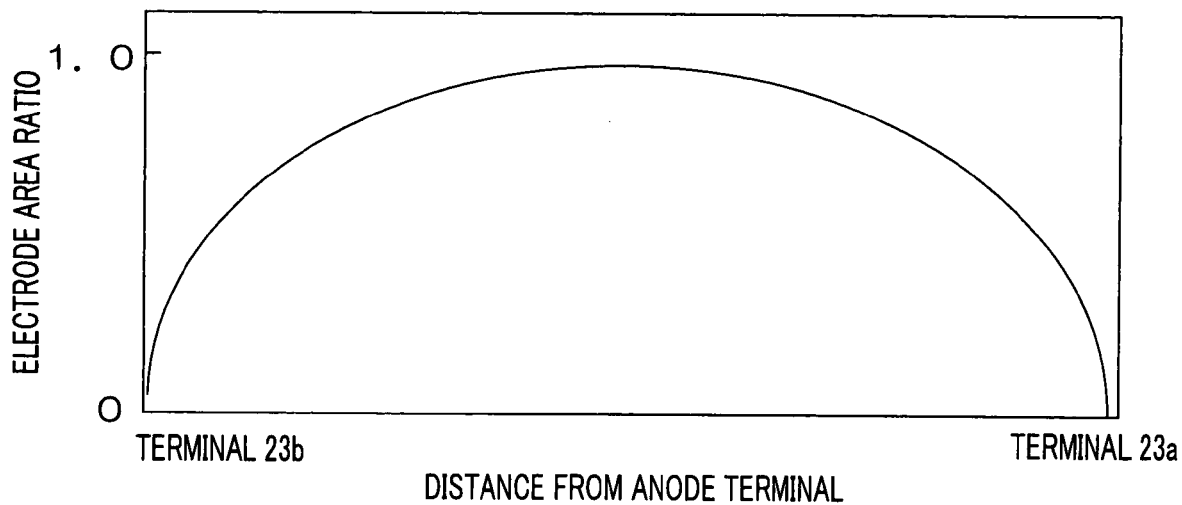
FIG. 10 is a schematic view showing a relationship between the light emission area and the distance from an anode terminal in a functional device of the invention.

FIG. 10 is a schematic view showing a relationship between the distance from the anode terminals in the functional device having the area pattern of the notches shown in FIG. 9, and the electrode area ratio (i.e., the light emission area ratio).

The electrode area ratio is the ratio of the area of the electrode in which the notch section is made to the area of the electrode having no notch section.

The left end and the right end of the transverse axis correspond to the terminals 23b and 23a, respectively. The vertical axis represents the electrode area ratio, and corresponds to the light emission area ratio since light is emitted from any site where the anode is present.

Figure 11:
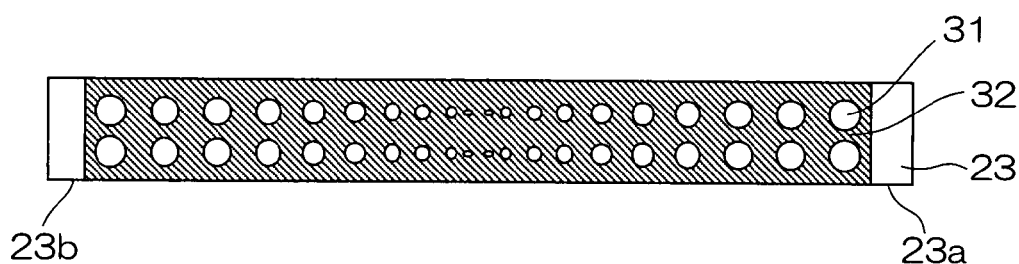
FIG. 11 is a schematic view showing another notch pattern in an anode electrode.

FIG. 11 is a schematic view showing another area pattern of the notches. The pattern has an area distribution of notch sections of two lines in the stripe-form anode.

Figure 12:
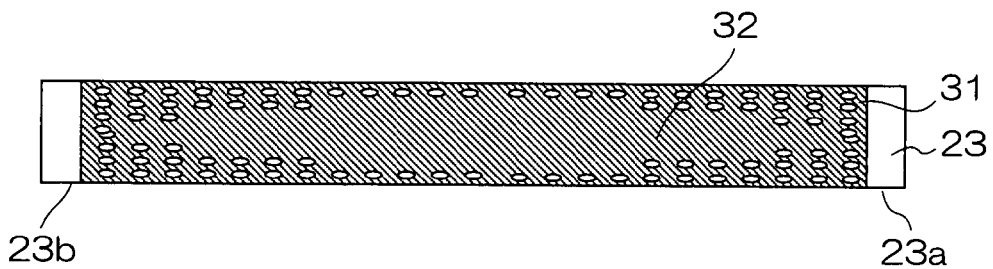
FIG. 12 is a schematic view showing still another notch pattern in an anode electrode.

FIG. 12 is a schematic view showing yet another area pattern of the notch section. The pattern has an area distribution of notch sections of plural lines in the stripe-form anode, and the notch section area ratio is made larger in side regions of the stripe-form electrode than in the central region, except at the terminals thereof. In this way, a secondary voltage drop which occurs from each of the long sides of the stripe toward the central region is further decreased.

The shape of the notch section(s) made in the anode may be any shape. It is preferred to calculate the electrode area corresponding to the relative ratio of the voltage drop and make the notch section(s) on the basis of the result of the calculation. When recognition of the notch section(s) with the naked eye is problematic, it is preferred to make notches having a size of several hundreds of micrometers or less as an aggregate of notches.

Figure 13:
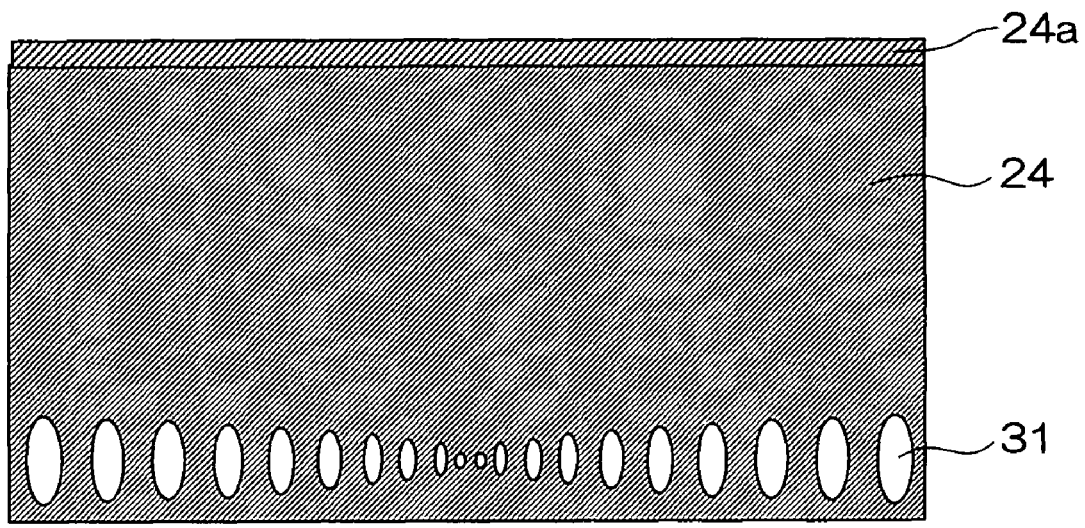
FIG. 13 is a schematic view showing a notch pattern formed in a cathode electrode.

FIG. 13 is a schematic view of still another embodiment of the functional device of the invention, which is a device in which notches are made in a cathode. Corresponding to a stripe-form anode 23, a notch section 31 is made at a position of a planar cathode 24 opposite to the anode. The notch section area decreases as the distance from each of anode terminals 23a and 23b increases.

Figure 14:
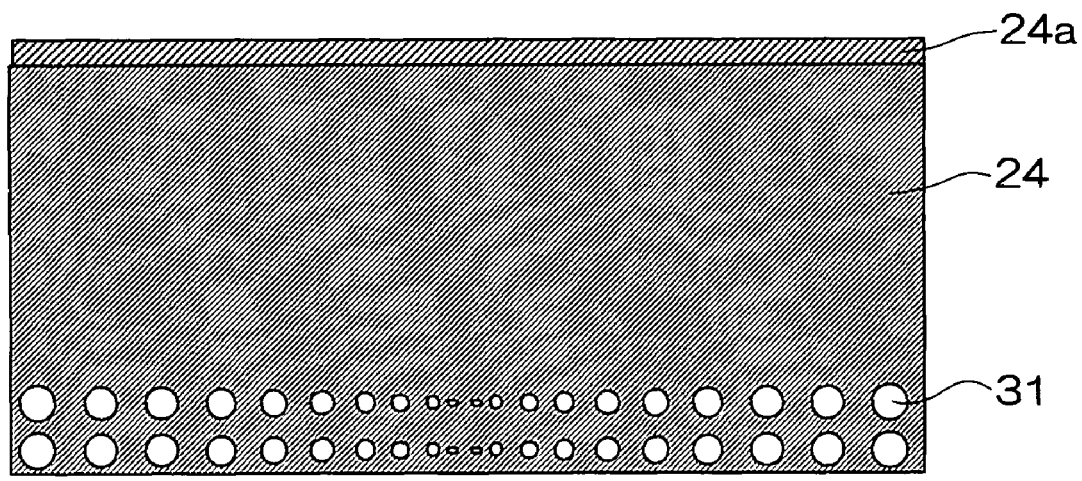
FIG. 14 is a schematic view showing another notch pattern formed in the cathode electrode.

FIG. 14 is a schematic view showing a further notch section pattern. Corresponding to a stripe-form anode, notch sections of two lines are made at positions of a planar cathode which are opposite to the anode. The area of each of the notch sections decreases as the distance from each of terminals increases.

Figure 15:
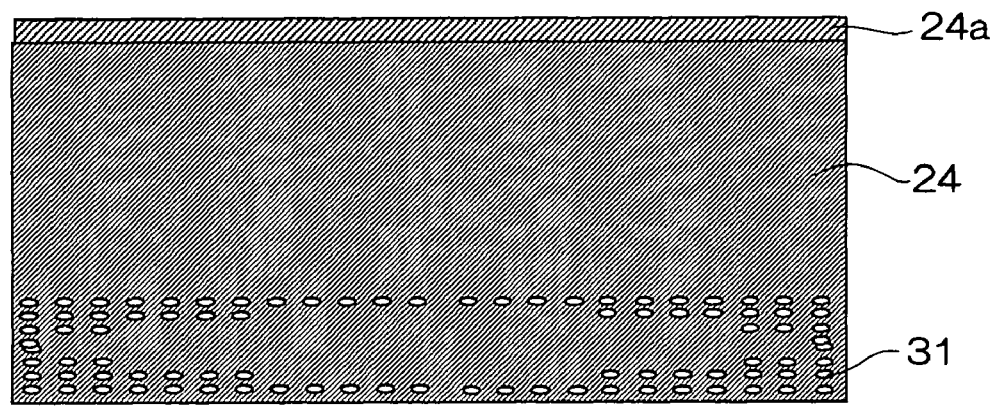
FIG. 15 is a schematic view showing still another notch pattern formed in the cathode electrode.

In an embodiment shown in FIG. 15, each of notch sections in a cathode is made of an aggregate of small-sized notches. The notch area is made smaller in the central region of a stripe-form electrode than in long side regions thereof. In this way, luminance unevenness is decreased which is due to a voltage drop caused from the long side region of the stripe toward the central region thereof.

The shape of the notch section(s) made in the cathode may be any shape. The notch section(s) is/are preferably made on the basis of the electrode area calculated corresponding to the relative ratio of the voltage drop. When a matter that the notch section(s) is/are recognized with the naked eye becomes a problem, it is preferred to make notches having a size of several hundreds of micrometers or less and make the notches into the form of an aggregate.

<Method for Making the Notch Section(s)>

In the case of making the notch section(s) in the anode, the notch section(s) can be made on the substrate by a physical method such as sputtering or ion plating, a chemical method such as CVD or plasma CVD, or some other method. In the case of using, for example, ITO as the material of the anode, a film is uniformly formed on the substrate by a method as described above and then stripes are formed in the film by photolithography and etching. After the formation of the stripes, one or more notch sections are made by photolithography and etching.

In the case of making the notch section(s) in the cathode, the notch section(s) can be made in the state that a mask is overlapped with the cathode.

3. Other Device-constituting Members (Resin Sealing Layer)

It is preferred in the functional device of the invention to form a resin sealing layer to restrain oxygen or water content from deteriorating the device performance due to contact of the device with the air.

The resin material of the resin sealing layer, the method for forming the layer, and the film thickness of the layer are the same as described about the first embodiment. Thus, description thereof is omitted herein.

(Sealing Adhesive)

A sealing adhesive is used in the present embodiment, and has a function of preventing water or oxygen from invading the functional device from its end portion.

In the present embodiment, the material of the sealing adhesive, the filler, the drying agent, the formulation of the sealing adhesive, and the method for sealing are also the same as described in the first embodiment. Thus, description thereof is omitted herein.

EXAMPLES

The invention will be more specifically described by way of the following examples. However, the invention is not limited to the examples.

Example 1

1. Production of an Organic Emitting Device According to the First Embodiment of the Invention (Formation of a Stripe Electrode)

An anode made of ITO was formed into a film having a thickness of 200 nm on a non-alkaline substrate by sputtering, and then the resultant was subjected to wet etching, thereby making the film into the form of stripes each having a width of 100 μm and a length of 50 cm at intervals of 100 μm.

In the stripe electrode, both ends thereof having a length of 3.5 cm from edges thereof were each used as a terminal.

(Formation of an Insulating Layer)

A voltage drop was estimated from the above-mentioned shape, the distance from the anode terminal, the electrode resistance, and the I-V characteristic of a functional device to be formed. Corresponding to the resultant voltage drop distribution, an insulating layer was formed in such a manner that the density of the insulator was reduced as the voltage drop increased in the distribution. The insulating layer was made of a photosensitive resin (a novolak resin), and was formed into a film thickness of 1 μm by photolithography.

(Formation of an Organic EL Layer)

Next, a vapor deposition mask having openings at predetermined positions was used to deposit an organic EL layer.

In this case, the organic EL layer was formed by depositing successively 4,4',4''-tris(3-methylphenylphenylamino)triphenylamine [MTDATA] into a hole injecting layer 30 nm in thickness, N,N'-dinaphthyl-N,N'-diphenyl-[1,1'-biphenyl]-4,4'-diamine) [α-NPD] into a hole transporting layer 20 nm in thickness, tris(8-hydroxyquinolinate)aluminum [Alq3], as a host, doped with 1,3,6,8-tetra[N-(naphthyl)-N-phenylamino] pyrene [t(npa)py], as an emitting material, into an emitting layer 30 nm in thickness, and Alq3 into an electron transporting layer 20 nm in thickness by vacuum deposition.

Next, a vapor deposition mask for upper electrode formation, having openings at predetermined positions, was used to form an upper electrode made of Al so as to cover the organic EL layer, thereby producing an organic EL device 1.

(Production of a Comparative Organic EL Device A)

A comparative organic EL device A was produced in the same way for producing the organic EL device 1 except that the insulating layer was not formed.

2. Items and Results of Performance Evaluation

A luminance unevenness evaluation device was used to evaluate the luminance unevenness along a line. Regarding a condition for driving the device, a voltage of 180 V was applied to both ends of the anode.

Figure 6:
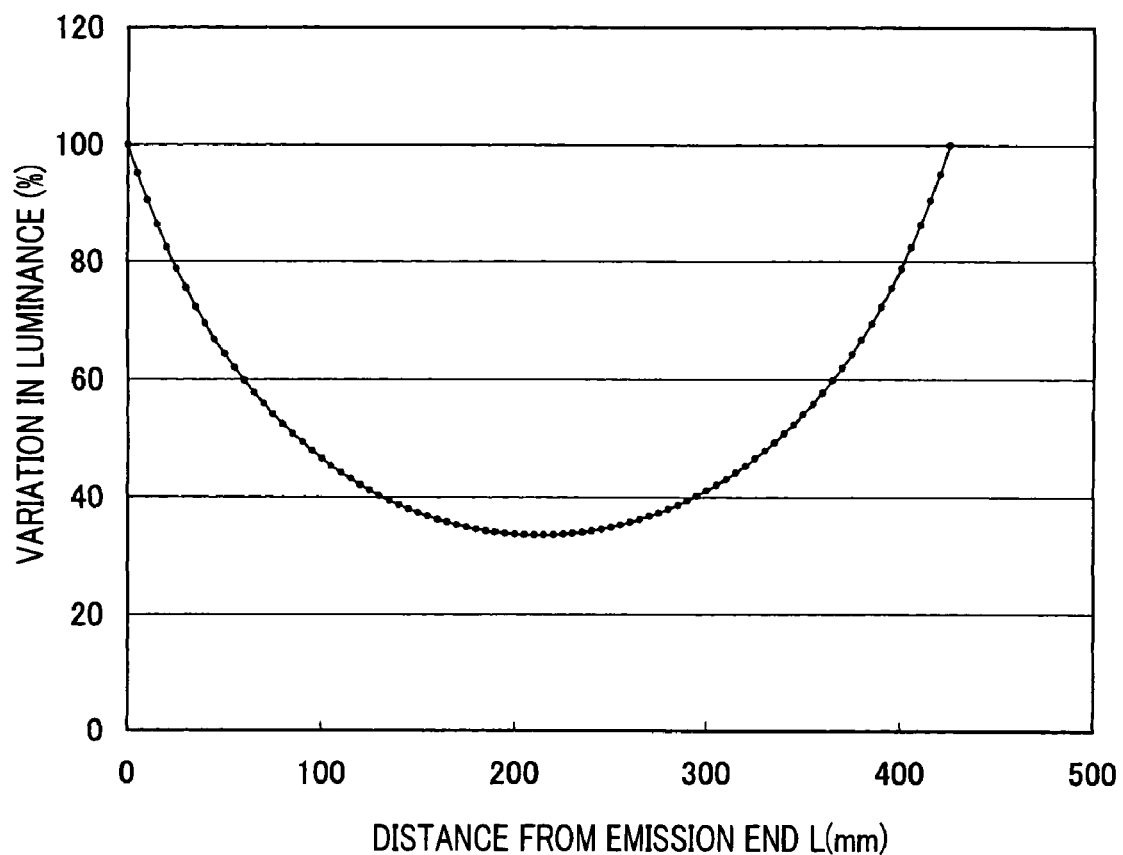
FIG. 6 is a measurement chart of the luminance unevenness of a comparative organic EL device having no insulating layer.
Figure 7:
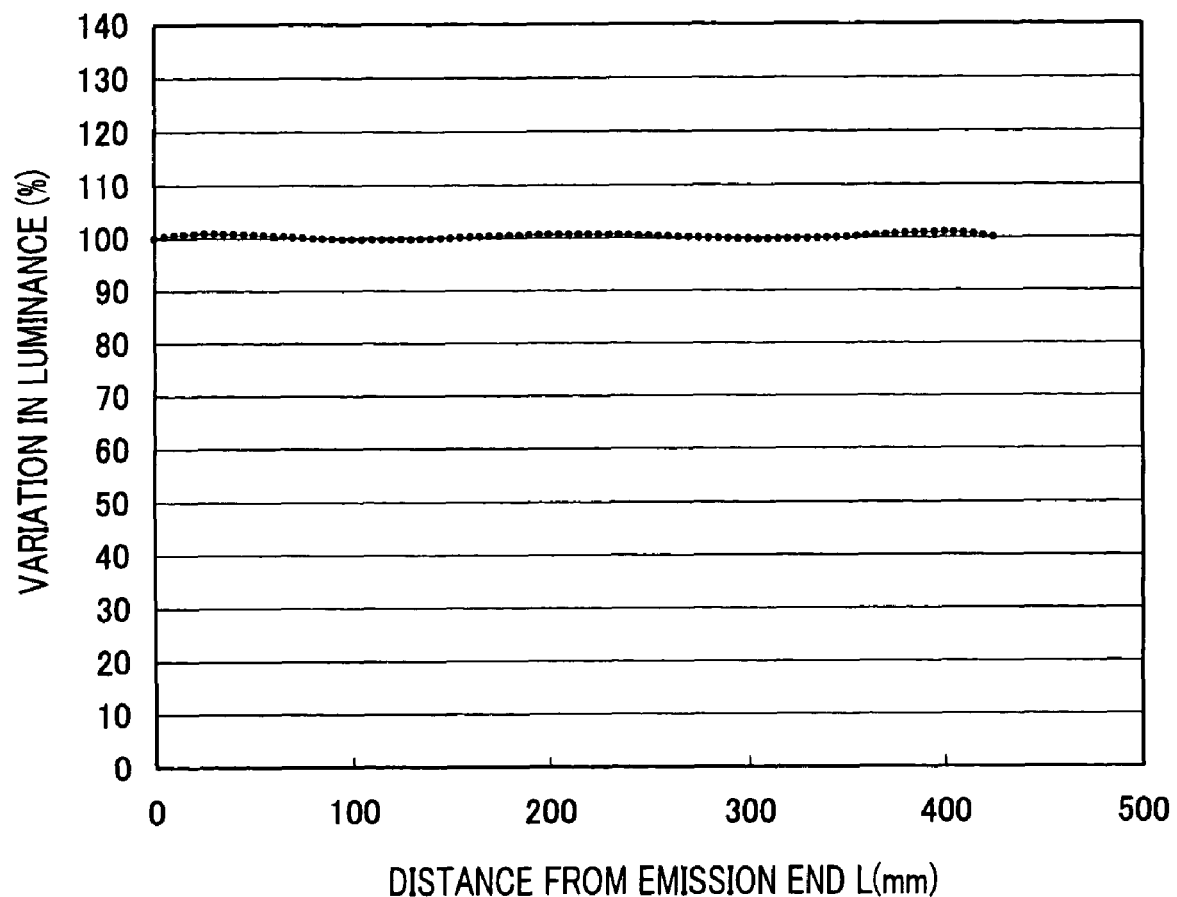
FIG. 7 is a measurement chart of the luminance unevenness of an organic EL device of the invention having an insulator having a density distribution.

The measurement results of the luminance unevenness are shown in FIGS. 6 and 7. FIG. 6 shows the measurement result of the comparative organic EL device A. FIG. 7 shows the measurement results of the organic EL device 1 of the invention. The zero point on the transverse axis corresponds to one of the anode terminals. The point of 430 mm corresponds to the other thereof. Therebetween is present a light emitting region.

It can be understood from FIGS. 6 and 7 that: in the device having no insulator, the luminance of the central region, which is farthest from both of the terminals, is lower than that of the vicinity of each of the terminals by about 60% or more; and in the invention, wherein an insulating layer is formed, the luminance unevenness in entire regions thereof can be made small (a variation of 5% or less).

Example 2

1. Production of an Device According to the Second Embodiment of the Invention (Formation of a Stripe Electrode)

An anode made of ITO was formed into a film having a thickness of 200 nm on a non-alkaline substrate by sputtering, and then the resultant was subjected to wet etching, thereby making the film into the form of stripes each having a width of 100 μm and a length of 50 cm at intervals of 100 μm.

In the stripe electrode, both ends thereof having a length of 3.5 cm from edges thereof were each used as a terminal.

(Formation of an Organic EL Layer)

Next, a vapor deposition mask having openings at predetermined positions was used to deposit an organic EL layer.

In this case, the organic EL layer was formed by depositing successively 4,4',4''-tris(3-methylphenylphenylamino)triphenylamine [MTDATA] into a hole injecting layer 30 nm in thickness, N,N'-dinaphthyl-N,N'-diphenyl-[1,1'-biphenyl]-4,4'-diamine) [α-NPD] into a hole transporting layer 20 nm in thickness, tris(8-hydroxyquinolinate)aluminum [Alq3], as a host, doped with 1,3,6,8-tetra[N-(naphthyl)-N-phenylamino] pyrene [t(npa)py], as an emitting material, into an emitting layer 30 nm in thickness, and Alq3 into an electron transporting layer 20 nm in thickness by vacuum deposition.

(Formation of a Planar Cathode)

Next, a vapor deposition mask for upper electrode formation, having openings at predetermined positions, was used to form an upper electrode made of Al so as to cover the organic EL layer. A notch section described below was made at a position of the cathode opposite to the stripe anode so as to yield a device 21 of the invention.

Regarding the device 21, in the cathode portion (light emitting section) opposite to the anode, the area of a notch section decreased as the distance from each of terminals of the stripe-form anode increased. A voltage drop was estimated from the distance from the anode terminal, the electrode resistance, and the I-V characteristic of the functional device to be formed; corresponding to the resultant voltage drop distribution, an area pattern was formed so that the larger the voltage drop became, the smaller notch section area was made.

A comparative device B was produced in the same way as described above except that a uniform cathode having no notch section was formed by vapor deposition.

2. Performance Evaluation (Measurement of the Emission Intensity Distributions)

A luminance unevenness evaluating device was used to evaluate the luminance unevenness of each of the devices along a line. Regarding a condition for driving the device, a voltage of 180 V was applied to both ends of the anode.

Figure 16:
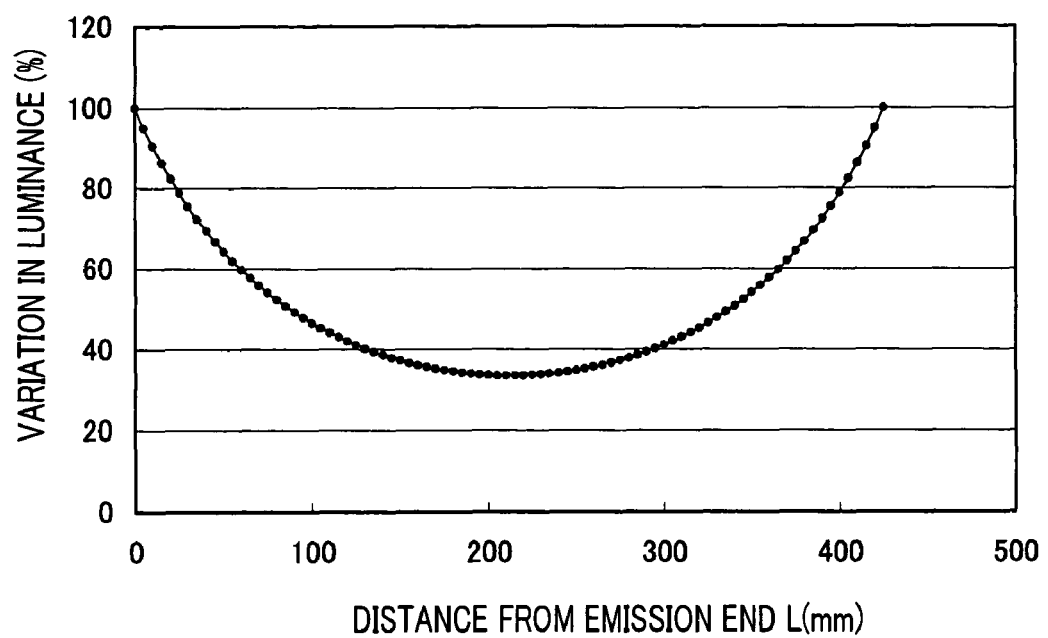
FIG. 16 is a measurement chart of the luminance unevenness of a comparative organic device having no notch section.
Figure 17:
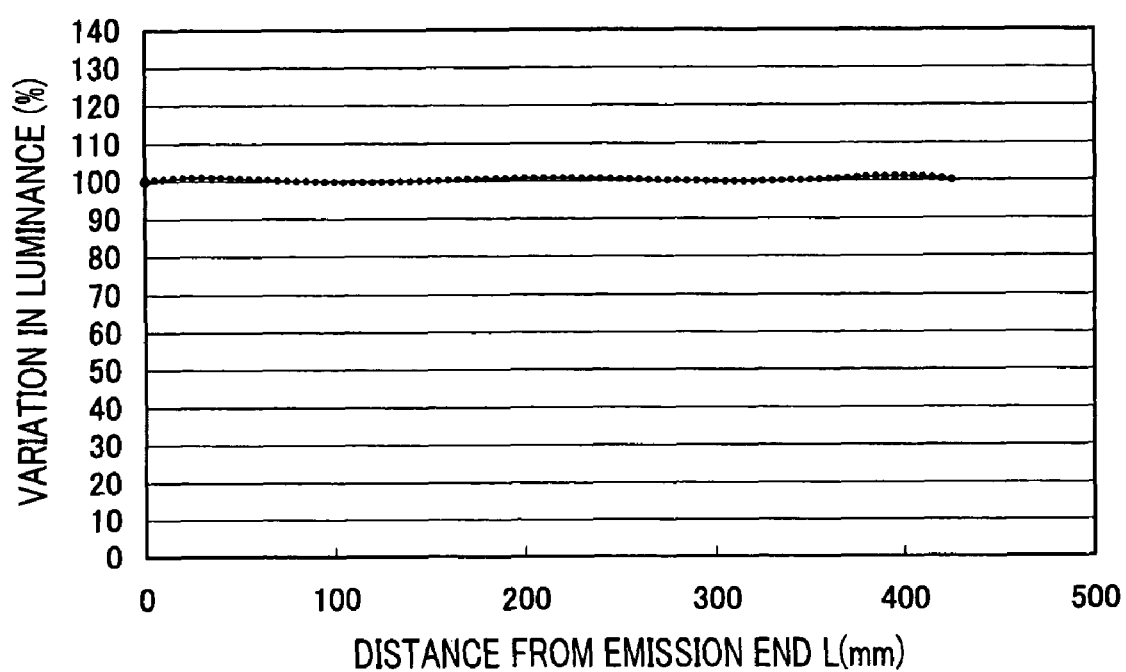
FIG. 17 is a measurement chart of the luminance unevenness of an organic EL device of the invention having a notch section.

The measurement results of the luminance unevenness are shown in FIGS. 16 and 17. The zero point on the transverse axis corresponds to one of the anode terminals. The point of 430 mm corresponds to the other thereof. Therebetween is present a light emitting region.

FIG. 16 shows the measurement result of the comparative organic EL device B. The luminance of the central region, which was farthest from both of the terminals, was lower than that of the vicinity of each of the terminals by about 60% or more. On the other hand, in the device 21 of the invention, the luminance of the vicinity of each of the terminals was substantially equal to that of the central region, and the luminance unevenness was 5% or less. It can be understood that when a notch section having an area corresponding to a voltage drop is provided in an electrode in this way, luminance unevenness can be remarkably decreased.

The foregoing description of the embodiments of the present invention has been provided for the purposes of illustration and description. It is not intended to be exhaustive or to limit the invention to the precise forms disclosed. Obviously, many modifications and variations will be apparent to practitioners skilled in the art. The embodiments were chosen and described in order to best explain the principles of the invention and its practical applications, thereby enabling others skilled in the art to understand the invention for various embodiments and with the various modifications as are suited to the particular use contemplated. It is intended that the scope of the invention be defined by the following claims and their equivalents.

All publications, patent applications, and technical standards mentioned in this specification are herein incorporated by reference to the same extent as if each individual publication, patent application, or technical standard was specifically and individually indicated to be incorporated by reference.

What is claimed is:

1. An organic electroluminescent device, comprising, on a substrate:
   a pair of electrodes;
   a terminal that is arranged at an edge of at least one of the electrodes and via which an electric current is applied to at least one of the electrodes;
   a functional layer that comprises an organic electroluminescent material and is arranged between the pair of electrodes; and
   a layer that comprises an insulator and is arranged between one of the electrodes and the functional layer,
   wherein an emission intensity of the functional layer varies in accordance with an electric current applied to one of the electrodes via the terminal, and
   wherein the insulator is distributed in the layer such that a density of the insulator gradually decreases as a distance from the terminal increases, thereby reducing a voltage drop caused by the increase in the distance from the terminal and reducing luminance unevenness caused by the voltage drop.

2. The organic electroluminescent device according to claim 1, wherein the insulator is discontinuously distributed in the layer.

3. The organic electroluminescent device according to claim 2, wherein the functional layer comprises an electroconductive material that is continuously formed.

4. The organic electroluminescent device according to claim 1, wherein at least one of the electrodes is formed as a stripe.

5. The organic electroluminescent device according to claim 1, wherein the insulator is an organic material or an inorganic material having an electric resistance of 100Ω or more.

6. The organic electroluminescent device according to claim 1, wherein the insulator is a photosensitive resin or a thermosetting resin.

7. The organic electroluminescent device according to claim 1, wherein the insulator is selected from the group consisting of silicon nitride, silicon oxynitride, silicon oxide, and silicon carbide.

8. The organic electroluminescent device according to claim 1, wherein the density of the insulator varies by varying a number of portions and/or an area of the insulator.

9. The organic electroluminescent device according to claim 3, wherein the functional layer is embedded in gaps between discontinuous portions of the insulator.

10. The organic electroluminescent device according to claim 9, wherein the continuous phase is formed by co-evaporation of the insulator and the electroconductive material.

* * * * *